(12) United States Patent
Ishikawa

(10) Patent No.: US 12,738,711 B2
(45) Date of Patent: Sep. 15, 2026

(54) WAVELENGTH TUNABLE LASER DEVICE AND METHOD OF MANUFACTURING THE SAME

(71) Applicant: Sumitomo Electric Industries, Ltd., Osaka (JP)

(72) Inventor: Tsutomu Ishikawa, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 485 days.

(21) Appl. No.: 18/499,354

(22) Filed: Nov. 1, 2023

(65) Prior Publication Data

US 2024/0178634 A1 May 30, 2024

(30) Foreign Application Priority Data

Nov. 30, 2022 (JP) ................................ 2022-192108

(51) Int. Cl.

*H01S 5/10* (2021.01)
*G02F 1/01* (2006.01)
*H01S 5/06* (2006.01)
*H01S 5/343* (2006.01)

(52) U.S. Cl.

CPC .......... *H01S 5/0612* (2013.01); *G02F 1/0147* (2013.01); *H01S 5/1007* (2013.01); *H01S 5/101* (2013.01); *H01S 5/3434* (2013.01); *H01S 5/34386* (2013.01)

(58) Field of Classification Search

CPC ...... H01S 5/0612; H01S 5/1007; H01S 5/101; H01S 5/021; H01S 5/0239

See application file for complete search history.

(56) References Cited

U.S. PATENT DOCUMENTS

2001/0038101 A1* 11/2001 Nemoto ................ H01S 5/4031 257/89
2008/0198888 A1 8/2008 Arimoto
2010/0189143 A1 7/2010 Fukuda
2012/0320939 A1* 12/2012 Baets .................... H01S 5/1032 372/45.01
2014/0079082 A1* 3/2014 Feng ...................... H01S 5/101 372/20

(Continued)

FOREIGN PATENT DOCUMENTS

JP 2001050860 A 2/2001
JP 2008198957 A 8/2008

(Continued)

OTHER PUBLICATIONS

Kobayashi, N., et al., "Silicon Photonic Hybrid Ring-Filter External Cavity Wavelength Tunable Lasers," Journal of Lightwave Technology, vol. 33, No. 6, Mar. 15, 2015.

*Primary Examiner* — Xinning(Tom) Niu
(74) *Attorney, Agent, or Firm* — Volpe Koenig

(57) ABSTRACT

A wavelength tunable laser device includes a substrate, a plurality of first optical waveguides provided in the substrate, and a plurality of semiconductor elements bonded on a surface of the substrate and on the plurality of first optical waveguides. The semiconductor elements are formed of a III-V group compound semiconductor and have optical gains. Wavelengths with which the optical gains of the plurality of semiconductor elements reach peaks differ from one another.

17 Claims, 7 Drawing Sheets

(56) References Cited

U.S. PATENT DOCUMENTS

| | | | | |
|---|---|---|---|---|
| 2015/0016767 | A1* | 1/2015 | Akiyama | G02F 1/225 385/3 |
| 2016/0170286 | A1* | 6/2016 | le Liepvre | H01S 5/142 385/2 |
| 2019/0265409 | A1* | 8/2019 | Baehr-Jones | H01S 5/5027 |
| 2021/0143609 | A1 | 5/2021 | Hiratani | |

FOREIGN PATENT DOCUMENTS

| | | | |
|---|---|---|---|
| JP | 2009537871 | A | 10/2009 |
| JP | 2010171329 | A | 8/2010 |
| JP | 2013012515 | A | 1/2013 |
| JP | 2013026543 | A | 2/2013 |
| JP | 2021077772 | A | 5/2021 |
| JP | 2022527104 | A | 5/2022 |
| WO | 2008005721 | A2 | 1/2008 |
| WO | 2020205450 | A1 | 10/2020 |

* cited by examiner

WAVELENGTH TUNABLE LASER DEVICE AND METHOD OF MANUFACTURING THE SAME

CROSS REFERENCE TO RELATED APPLICATIONS

This application claims priority based on Japanese Patent Application No. 2022-192108 filed on Nov. 30, 2022, and the entire contents of the Japanese patent application are incorporated herein by reference.

TECHNICAL FIELD

The present disclosure relates to a wavelength tunable laser device and a method of manufacturing the same.

BACKGROUND

A wavelength tunable laser device is known (for example, Naoki Kobayashi et al. "Silicon Photonic Hybrid Ring-Filter External Cavity Wavelength Tunable Lasers" Journal of Lightwave Technology, Vol. 33, No. 6, p. 1241, Mar. 15, 2015). The wavelength tunable laser device includes a semiconductor element having an optical gain, a ring resonator, and the like. An oscillation wavelength of light is changed by adjusting a resonant wavelength of the ring resonator.

SUMMARY

A wavelength tunable laser device according to the present disclosure includes a substrate, a plurality of first optical waveguides provided in the substrate, and a plurality of semiconductor elements bonded on a surface of the substrate and on the plurality of first optical waveguides. The semiconductor elements are formed of a III-V group compound semiconductor and have optical gains. Wavelengths with which the optical gains of the plurality of semiconductor elements reach peaks differ from one another.

A method of manufacturing a wavelength tunable laser device according to the present disclosure includes forming a plurality of first optical waveguides in a surface of a substrate and bonding a plurality of semiconductor elements on the surface of the substrate and on the plurality of first optical waveguides. The semiconductor elements are formed of a III-V group compound semiconductor and have optical gains. Wavelengths with which the optical gains of the plurality of semiconductor elements reach peaks differ from one another.

BRIEF DESCRIPTION OF THE DRAWINGS

FIG. 5 is a plan view of a wavelength tunable laser device for illustrating a method of manufacturing the wavelength tunable laser device.

FIG. 6 is a plan view of a wavelength tunable laser device for illustrating a method of manufacturing the wavelength tunable laser device.

DETAILED DESCRIPTION

Figure 1:
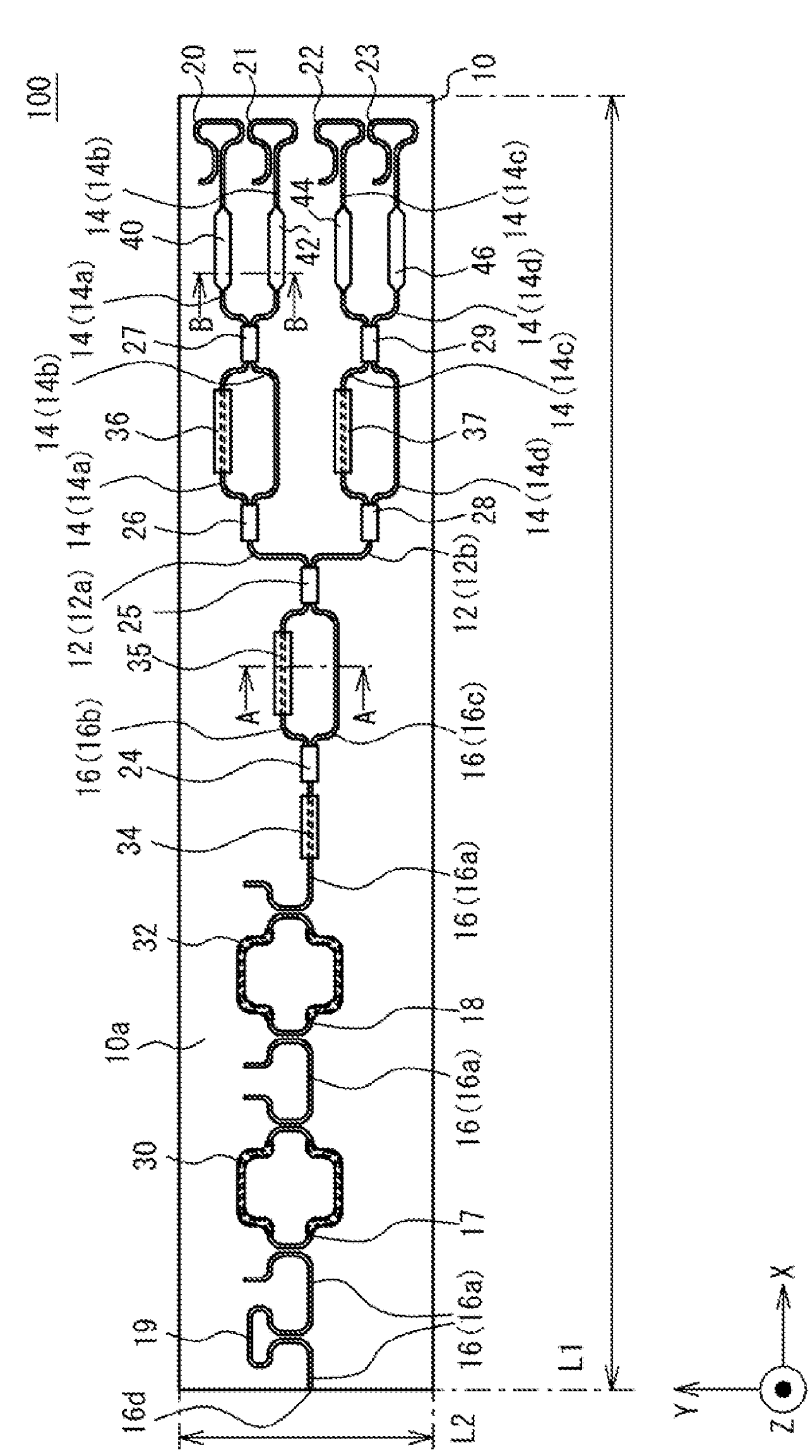
FIG. 1 is a plan view of a wavelength tunable laser device according to an embodiment.

In order to expand a wavelength range of emitted light, a plurality of semiconductor elements may be integrated. However, the size of a wavelength tunable laser device may be increased. Accordingly, an object of the present invention is to provide a wavelength tunable laser device which can be miniaturized and a method of manufacturing the same.

DESCRIPTION OF EMBODIMENTS OF PRESENT DISCLOSURE

First, the contents of embodiments according to the present disclosure will be listed and described.

(1) According to one aspect of the present disclosure, a wavelength tunable laser device includes a substrate, a plurality of first optical waveguides provided in the substrate, and a plurality of semiconductor elements bonded on a surface of the substrate and on the plurality of first optical waveguides. The semiconductor elements are formed of a III-V group compound semiconductor and have optical gains. Wavelengths with which the optical gains of the plurality of semiconductor elements reach peaks differ from one another. Light having different wavelengths can be emitted by using the plurality of semiconductor elements. Since the plurality of semiconductor elements are bonded on the substrate, the wavelength tunable laser device can be miniaturized.

(2) In the above (1), the wavelength tunable laser device may include a first selector provided in the substrate. The first selector may select a first optical waveguide configured to transmit light from among the plurality of first optical waveguides. One of the semiconductor elements is driven and a corresponding first optical waveguide of the first optical waveguides is selected. The light emitted from the one of the semiconductor elements can be propagated through the corresponding first optical waveguide.

(3) In the above (2), the first selector may include a heater. The heater may be provided over one of two of the first optical waveguides. The first selector may select a first optical waveguide configured to transmit light from among the two first optical waveguides. One of semiconductor elements is driven and a corresponding first optical waveguide of the first optical waveguides is selected. The light emitted from the one of the semiconductor elements can be propagated through the corresponding first optical waveguide (4) In any one of the above (1) to (3), the wavelength tunable laser device may include a second optical waveguide provided in the substrate. The second optical waveguide may be optically coupled to the plurality of first optical waveguides. The light emitted from the semiconductor elements propagates the second optical waveguide.

(5) In the above (4), the wavelength tunable laser device may include a second selector provided on the substrate. The second optical waveguide may be branched into two. One of the first optical waveguides may be optically coupled to one of the two branched second optical waveguides, and another one of the first optical waveguides may be optically coupled to the other one of the two branched second optical waveguides. The second selector may select a second optical waveguide configured to transmit light from among the two branched second optical waveguides. The light emitted from the semiconductor elements propagates the second optical waveguide.

(6) In the above (4) or (5), the wavelength tunable laser device may include a first reflector, and a second reflector. The first reflector may be optically coupled to the plurality of first optical waveguides. The second reflector may be located opposite to the first reflector across the plurality of semiconductor elements, and may be optically coupled to the second optical waveguide. The first reflector and the second reflector form a laser resonator. Light is reflected on the first reflector and the second reflector to cause laser oscillation. Since the first reflector is provided in the second optical waveguide, the wavelength tunable laser device can be miniaturized.

(7) In any one of (4) to (6), the wavelength tunable laser device may include a plurality of ring resonators provided in the substrate and optically coupled to the second optical waveguide. Since the ring resonators are provided in the second optical waveguide, the wavelength tunable laser device can be miniaturized.

(8) In the above (1) to (7), the semiconductor elements may include a first semiconductor layer, an active layer, and a second semiconductor layer. The first semiconductor layer, the active layer, and the second semiconductor layer may be stacked in this order on the substrate. The first semiconductor layer may have a first conductivity type. The second semiconductor layer may have a second conductivity type different from the first conductivity type. When forward bias voltages are applied, the semiconductor elements generate light. When reverse bias voltages are applied, the semiconductor elements easily absorb light.

(9) In the above (1) to (8), a difference among the wavelengths with which the optical gains of the plurality of semiconductor elements reach the peaks may be 10 nm or more. The wavelength of light can be varied over a range where the optical gains are high. Light can be efficiently emitted by driving the semiconductor elements in the range where the optical gains are high.

(10) A method of manufacturing a wavelength tunable laser device includes forming a plurality of first optical waveguides in a surface of a substrate and bonding a plurality of semiconductor elements on the surface of the substrate and on the plurality of first optical waveguides. The semiconductor elements are formed of a III-V group compound semiconductor and have optical gains. Wavelengths with which the optical gains of the plurality of semiconductor elements reach peaks differ from one another. Light having different wavelengths can be emitted by using the plurality of semiconductor elements. Since a plurality of semiconductor elements are bonded on the substrate, the wavelength tunable laser device can be miniaturized.

DETAILS OF EMBODIMENTS OF PRESENT DISCLOSURE

Specific examples of a wavelength tunable laser device and a method of manufacturing thereof according to an embodiment of the present disclosure will be described below with reference to the drawings. The present disclosure is not limited to these examples, and is defined by the scope of the claims, and is intended to include all modifications within the meaning and scope equivalent to the scope of the claims.

Embodiment

FIG. 1 is a plan view of a wavelength tunable laser device 100 according to an embodiment. Wavelength tunable laser device 100 is a hybrid type optical device including a substrate 10 and a plurality of semiconductor elements 40. Substrate 10 includes a surface 10*a* parallel to an XY-plane. The plurality of semiconductor elements 40 are bonded on surface 10*a* of substrate 10.

Substrate 10 has a rectangular planar shape. Two sides of substrate 10 extend parallel to an X-axis direction. The other two sides extend parallel to a Y-axis direction. A Z-axis direction is a normal direction of the XY-plane and is a stacking direction of layers. The X-axis direction, the Y-axis direction, and the Z-axis direction are orthogonal to one another. Substrate 10 has a length L1 of, for example, 5 mm in the X-axis direction. Substrate 10 has a length L2 of, for example, 2.5 mm in the Y-axis direction.

Substrate 10 is a silicon on insulator (SOI) substrate. An optical waveguide 12, an optical waveguide 14 (first optical waveguide), an optical waveguide 16, a ring resonator 17, a ring resonator 18, and loop mirrors 19, 20, 21, 22, and 23 are provided in surface 10*a* of substrate 10.

Optical waveguide 12 and optical waveguide 16 correspond to a second optical waveguide. Optical waveguide 16 includes optical waveguides 16*a* and 16*b* and 16*c*. One end portion 16*d* of optical waveguide 16*a* is located at an end portion of substrate 10 and functions as a light emitting port. Optical waveguide 16*a* includes a straight portion and a curved portion and extends from the end portion of substrate 10 to a coupler 24.

Loop mirror 19 (second reflector) and ring resonators 17 and 18 are provided in optical waveguide 16*a*. Between the end portion of substrate 10 and coupler 24, loop mirror 19, ring resonator 17, and ring resonator 18 are arranged in this order. Optical waveguide 16*a* is curved into a loop shape to form loop mirror 19.

Ring resonator 17 and ring resonator 18 are optically coupled to optical waveguide 16*a*. Ring resonator 17 has a diameter different from a diameter of ring resonator 18. Ring resonator 17 has a free spectral range (FSR, interval between two adjacent resonant wavelengths) of, for example, 2.7 nm. Ring resonator 18 has an FSR of, for example, 3.0 nm. Ring resonator 17 is provided with a heater 30. Ring resonator 18 is provided with a heater 32.

Optical waveguide 16 is branched into two at coupler 24. One end portion of optical waveguide 16*a* is optically coupled to one end portion of coupler 24. One end portion of each of optical waveguides 16*b* and 16*c* is optically coupled to the other end portion of coupler 24. Optical waveguide 16*b* is provided with a heater 35. Optical waveguide 16*c* is provided with no heater. The other end portions of optical waveguide 16*b* and 16*c* are optically coupled to one end portion of a coupler 25.

Optical waveguide 12 includes optical waveguides 12*a* and 12*b*. One end portion of each of optical waveguides 12*a* and 12*b* is optically coupled to the other end portion of coupler 25. The other end portion of optical waveguide 12*a* is optically coupled to a coupler 26. The other end portion of optical waveguide 12*b* is optically coupled to a coupler 28.

Optical waveguide 14 includes optical waveguides 14*a*, 14*b*, 14*c* and 14*d*. One end portion of each of optical waveguides 14*a* and 14*b* is optically coupled to coupler 26. A coupler 27 is provided in the middle of optical waveguides 14*a* and 14*b*. That is, optical waveguides 14*a* and 14*b* are branched at coupler 26, extend to one end portion of coupler 27, and are branched at the other end portion of coupler 27. A heater 36 is provided over a portion of optical waveguide 14*a* between coupler 26 and coupler 27. Optical waveguide 14*b* is provided with no heater.

Loop mirror 20 is provided in an end portion of optical waveguide 14*a* opposite to coupler 26. Loop mirror 21 is provided in an end portion of optical waveguide 14*b* opposite to coupler 26.

Semiconductor element 40 is bonded on a portion of optical waveguide 14*a* between coupler 27 and loop mirror 20. A semiconductor element 42 is bonded on a portion of optical waveguide 14*b* between coupler 27 and loop mirror 21.

Optical waveguides 14*c* and 14*d* are optically coupled to coupler 28. A coupler 29 is provided in the middle of optical waveguides 14*c* and 14*d*. A heater 37 is provided in a portion of optical waveguide 14*c* between coupler 28 and coupler 29. Optical waveguide 14*d* is provided with no heater.

Loop mirror 22 is provided in an end portion of optical waveguide 14*c* opposite to coupler 28. Loop mirror 23 is provided in an end portion of optical waveguide 14*d* opposite to coupler 28.

A semiconductor element 44 is bonded on a portion of optical waveguide 14*c* between coupler 29 and loop mirror 22. A semiconductor element 46 is bonded on a portion of optical waveguide 14*d* between coupler 29 and loop mirror 23.

Each of semiconductor elements 40, 42, 44 and 46 includes tapered portions at both ends. Each of tapered portions has a tapered shape along the optical waveguide. Loop mirror 19 has a light reflectance of, for example, 30%. Each of loop mirrors 20, 21, 22 and 23 is a first reflector. The optical reflectances of loop mirrors 20, 21, 22, and 23 are higher than the reflectance of loop mirror 19, for example, 90% or more, and may be close to 100%. Couplers 24, 25, 26, 27, 28, and 29 may be, for example, multi-mode interferences (MMIs) or directional couplers.

Figure 2A:
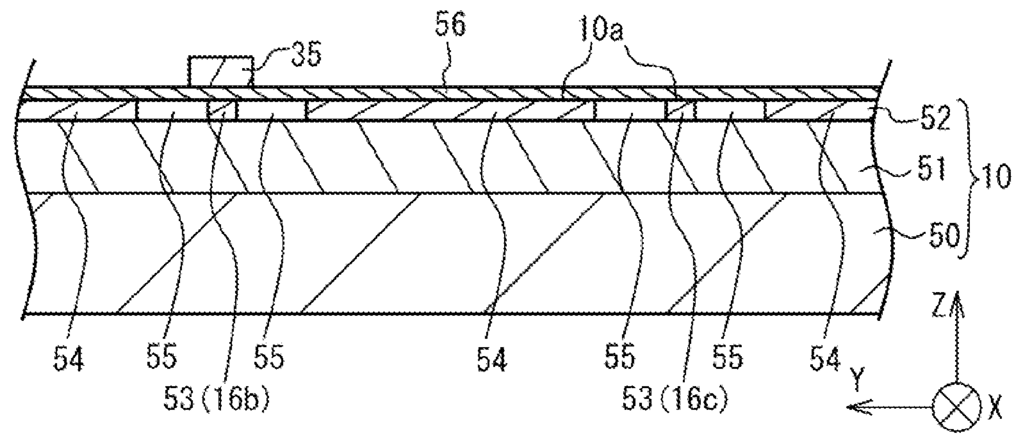
FIG. 2A is a cross-sectional view taken along line A-A in FIG. 1.

FIG. 2A is a cross-sectional view taken along line A-A in FIG. 1 and shows a cross-sectional view including two optical waveguides 16*b* and 16*c* and heater 35. Substrate 10 is an SOI substrate and includes a substrate 50, a box layer 51, and a silicon (Si) layer 52. Box layer 51 is stacked on a surface of substrate 50. Si layer 52 is stacked on a surface of box layer 51 opposite to substrate 50.

Si layer 52 includes a waveguide core 53, a terrace 54 and a groove 55. The surface of terrace 54 is a plane of Si. Waveguide core 53 is spaced apart from terrace 54. Groove 55 is provided between terrace 54 and waveguide core 53. The surfaces of waveguide core 53 and terrace 54 form plane 10*a* of substrate 10. Groove 55 is recessed from surface 10*a*, and may penetrate Si layer 52 in the Z-axis direction or may extend to the middle of Si layer 52 in the Z-axis direction.

Substrate 50 is formed of, for example, Si. Box layer 51 is formed of, for example, silicon oxide ($SiO_2$). Si layer 52 is formed of Si having a thickness of 0.22 μm, for example. Waveguide core 53 has a width of, for example, 0.42 μm.

One of two waveguide cores 53 in FIG. 2A functions as optical waveguide 16*b*. The other one of waveguide cores 53 functions as optical waveguide 16*c*. Waveguide core 53 forms the optical waveguides, the loop mirrors and the ring resonators of wavelength tunable laser device 100.

As shown in FIG. 2A, a top surface of Si layer 52 is covered with an insulating film 56. Heater 35 is provided on a top surface of insulating film 56 and over optical waveguide 16*b*. Insulating film 56 is formed of an insulator such as silicon nitride (SiN). Heater 35 is formed of a metal such as platinum (Pt).

Figure 2B:
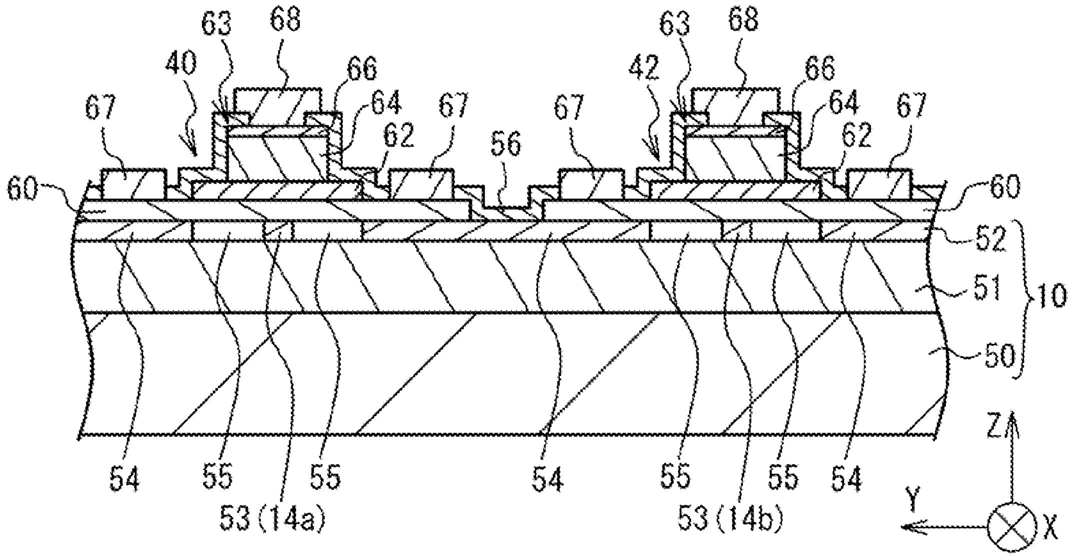
FIG. 2B is a cross-sectional view taken along line B-B in FIG. 1.

FIG. 2B is a cross-sectional view taken along line B-B in FIG. 1 and shows a cross-section including semiconductor elements 40 and 42. Semiconductor element 40 is bonded on optical waveguide 14*a*. Semiconductor element 42 is bonded on optical waveguide 14*b*.

Semiconductor element 40 includes a cladding layer 60 (first semiconductor layer), an active layer 62, a cladding layer 64, and a contact layer 66 (cladding layer 64 and contact layer 66 are second semiconductor layers). Cladding layer 60 is in contact with Si layer 52 of substrate 10 and disposed over waveguide core 53, groove 55, and terrace 54. Active layer 62, cladding layer 64, and contact layer 66 are stacked in this order on cladding layer 60. Each mesa 63 includes active layer 62, cladding layer 64 and contact layer 66 and is disposed over waveguide core 53.

Insulating film 56 covers a top surface of cladding layer 60 and side and top surfaces of each mesa 63. In insulating film 56, openings are formed over cladding layer 60 and over each mesa 63. An electrode 67 is provided in the opening over cladding layer 60 and is in contact with the top surface of cladding layer 60. An electrode 68 is provided in the opening over each mesa 63 and is in contact with the top surface of contact layer 66.

Cladding layer 60 is formed of, for example, n-type (first conductivity type) indium phosphide (InP). Active layer 62 includes a plurality of well layers and a plurality of barrier layers. The plurality of well layers and the plurality of barrier layers are alternately stacked to form a multi quantum well (MQW) structure. The well layers and the barrier layers are formed of gallium indium arsenide phosphide (GaInAsP), for example. Cladding layer 64 is formed of, for example, p-type (second conductivity type) InP. Contact layer 66 is formed of, for example, p-type indium gallium arsenide (InGaAs). The semiconductor layers of the semiconductor elements may be formed of a III-V group compound semiconductor other than semiconductors described above.

Electrode 67 is formed of a metal such as a stacked body of gold, germanium, and nickel (Au/Ge/Ni). Electrode 68 is formed of a metal such as a stacked body of titanium, platinum, and gold (Ti/Pt/Au).

Semiconductor elements 42, 44 and 46 have the same configuration as semiconductor element 40. As shown in FIG. 2B, semiconductor element 40 is spaced apart from semiconductor element 42. The semiconductor layers and the electrodes of semiconductor element 40 are not in contact with the semiconductor layers and the electrodes of semiconductor element 42. Four semiconductor elements 40, 42, 44 and 46 are spaced apart and electrically isolated from one another. The four semiconductor elements are controlled independently of one another.

The four semiconductor elements have optical gains. When forward bias voltages are applied to the semiconductor elements, the semiconductor elements generate light. The application of the forward bias voltage means that a positive voltage is applied to electrode 68 and a negative voltage is applied to electrode 67. Current flows between contact layer 66 and cladding layer 60, carriers are injected into active layer 62, and light is generated. The semiconductor elements and the optical waveguides are optically coupled to each other by evanescent light coupling, and light is transferred between them.

When reverse bias voltages are applied to the semiconductor elements, the semiconductor elements easily absorb light. The application of the reverse bias voltage means that a negative voltage is applied to electrode 68 and a positive voltage is applied to electrode 67. Active layer 62 absorbs light and generates carriers. The carriers cause a current flow.

Figure 3A:
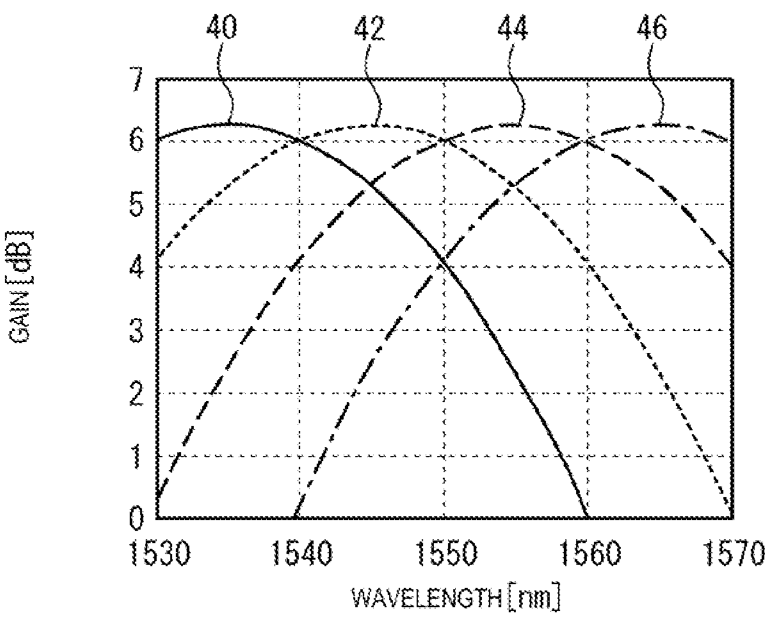
FIG. 3A is a diagram illustrating an optical gain of a semiconductor element.

FIG. 3A is a diagram illustrating the optical gains of the semiconductor elements. A horizontal axis represents a wavelength. A vertical axis represents the gain (optical gain). The semiconductor elements have a length of 500 μm in the X-axis direction. A current of 100 mA flows through the semiconductor elements.

The gain of semiconductor element 40 is represented by a solid line in FIG. 3A and has a peak around a wavelength of 1535 nm. The gain of semiconductor element 42 is represented by a dotted line and has a peak around a wavelength of 1545 nm. The gain of semiconductor element 44 is represented by a dashed line and has a peak around a wavelength of 1555 nm. The gain of semiconductor element 46 is represented by a one-dot chain line, and has a peak around a wavelength of 1565 nm. The difference among the wavelengths with which the optical gains of the plurality of semiconductor elements reach the peaks is 10 nm or more, for example. The difference in peak wavelength is caused by a difference in composition of each active layer 62. The peak values of the gains are higher than 6 dB and are of equal magnitude in each of semiconductor elements.

The four semiconductor elements are used as light-emitting elements in wavelength bands in which the respective semiconductor elements have high gains. For example, semiconductor element 40 is used as a light-emitting element in a range from about 1530 nm to about 1540 nm. Semiconductor element 42 is used as a light-emitting element in a range from about 1540 nm to about 1550 nm. Semiconductor element 44 is used as a light-emitting element in a range from about 1550 nm to about 1560 nm. Semiconductor element 46 is used as a light-emitting element in a range from about 1560 nm to about 1570 nm. In each of the bands, a forward bias voltage is applied to a semiconductor element used as a light-emitting element among the semiconductor elements. Reverse bias voltages are applied to the other three semiconductor elements that are not used.

Figure 3B:
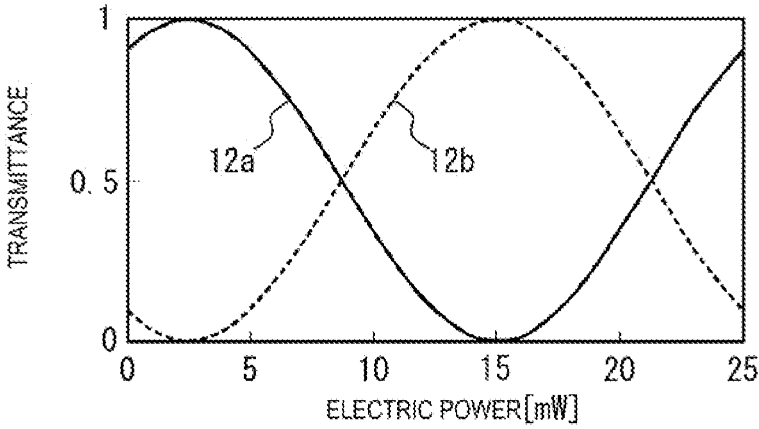
FIG. 3B is a diagram illustrating a light transmittance of an optical waveguide.

FIG. 3B is a diagram illustrating light transmittances of optical waveguides. A horizontal axis represents an electric power to be input to a heater. Heater 35 provided in optical waveguide 16*b* is used as an example. Heater 35 has a length of 500 μm. A vertical axis represents the light transmittance, and here, a ratio of light emitted to optical waveguide 12*a* or 12*b* to light incident on coupler 24 is defined as the light transmittance to optical waveguide 12*a* or 12*b*, respectively. A solid line represents the light transmittance to optical waveguide 12*a*. A dotted line represents the light transmittance to optical waveguide 12*b*.

When current flows through heater 35, heater 35 generates heat. A refractive index of the optical waveguide changes with a temperature thereof. The change in index of refraction facilitates light propagation into one of two optical waveguides 16*b* and 16*c*. As shown in FIG. 3B, the light transmittance periodically changes like a sine curve, for example, in response to a change in electric power. The transmittance to optical waveguide 12*a* and the transmittance to optical waveguide 12*b* are in opposite phases to each other. When the electric power is from 0 to 2.5 mW, the transmittance to optical waveguide 12*a* increases. The transmittance to optical waveguide 12*b* decreases. When the electric power is 2.5 mW, the transmittance to optical waveguide 12*a* is one. The transmittance to optical waveguide 12*b* is zero. In an electric power of 2.5 mW to 15 mW, the transmittance to optical waveguide 12*a* decreases. The transmittance to optical waveguide 12*b* increases. When the electric power is 15 mW, the transmittance to optical waveguide 12*a* is zero. The transmittance to optical waveguide 12*b* is 1.

When the electric power is 2.5 mW, the transmittance to optical waveguide 12*a* maximized, and the transmittance to optical waveguide 12*b* is minimized. When the electric power is 15 mW, the transmittance to optical waveguide 12*b* is maximized, and the transmittance to optical waveguide 12*a* is minimized. By controlling the electric power, it is possible to select an optical waveguide configured to transmit light from among two optical waveguides 12*a* and 12*b*. Heater 35 functions as a selector (second selector) that selects an optical waveguide configured to transmit light from among optical waveguides 12*a* and 12*b*.

The same relationship as in FIG. 3B is established between the electric power to be input to heater 36 and the light transmittance to optical waveguide 14*a* and the light transmittance to optical waveguide 14*b*. Heater 36 functions as a selector (first selector) that selects an optical waveguide configured to transmit light from among two optical waveguides 14*a* and 14*b*. The same relationship as shown in FIG. 3B is established between the electric power to be input to heater 37 and the light transmittance to optical waveguide 14*c* and the light transmittance to optical waveguide 14*d*. Heater 37 functions as a selector (first selector) that selects an optical waveguide configured to transmit light from among two optical waveguides 14*c* and 14*d*.

Examples of the operation of wavelength tunable laser device 100 will now be described. In Example A, light is emitted from semiconductor element 40. In Example B, light is emitted from semiconductor element 42. In Example C, light is emitted from semiconductor element 44. In Example D, light is emitted from semiconductor element 46. Table 1 illustrates the states of the semiconductor elements. Table 2 illustrates the states of the heaters.

TABLE 1

| | Semiconductor element 40 | Semiconductor element 42 | Semiconductor element 44 | Semiconductor element 46 |
|---|---|---|---|---|
| A | Forward bias (100 mA) | Reverse bias (−1 V) | | |
| B | Reverse bias (−1 V) | Forward bias (100 mA) | Reverse bias (−1 V) | |
| C | Reverse bias (−1 V) | | Forward bias (100 mA) | Reverse bias (−1 V) |
| D | Reverse bias (−1 V) | | | Forward bias (100 mA) |

TABLE 2

| | Heater 35 | Heater 36 | Heater 37 |
|---|---|---|---|
| A | 2.5 mW (Optical waveguide 12a) | 2.5 mW (Optical waveguide 14a) | Off |
| B | 2.5 mW (Optical waveguide 12a) | 15 mW (Optical waveguide 14b) | Off |
| C | 15 mW (Optical waveguide 12b) | Off | 2.5 mW (Optical waveguide 14c) |
| D | 15 mW (Optical waveguide 12b) | Off | 15 mW (Optical waveguide 14d) |

In Example A, a forward bias voltage is applied to semiconductor element 40 as shown in Table 1, and a current of 100 mA flows. For example, a reverse bias voltage of −1 V is applied to each of semiconductor elements 42, 44, and 46. Semiconductor element 40 emits light. The light absorptivities of semiconductor elements 42, 44 and 46 become higher than that of semiconductor element 40. As shown in Table 2, an electric power of 2.5 mW is input to heater 35. Among optical waveguide waveguides 12*a* and 12*b*, optical waveguide 12*a* is selected as an optical path. An electric power of 2.5 mW is input to heater 36. Among optical waveguides 14*a* and 14*b*, optical waveguide 14*a* is selected as an optical path. Optical waveguides 12*b* and 14*b* are lower in light transmittance than optical waveguides 12*a* and 14*a*. Power is not input to heater 37 (in an off state). The light transmittances of optical waveguides 14*c* and 14*d* are lower than those of optical waveguides 12*a* and 14*a*.

In Example A, light emitted from semiconductor element 40 propagates through optical waveguides 14*a* and 12*a* and also propagates through optical waveguide 16. Optical waveguide 14*a* is provided with loop mirror 20. Optical waveguide 16 is provided with loop mirror 19. The two loop mirrors, the optical waveguides and semiconductor element 40 form a laser resonator. The light propagates through the optical waveguides and is repeatedly reflected on loop mirror 19 and loop mirror 20 to cause laser oscillation.

Power is also input to heaters 30, 32 and 34. The electric power is input to heaters 30 and 32 to shift a resonant wavelength of ring resonator 17 and a resonant wavelength of ring resonator 18. Light is laser-oscillated at a wavelength with which the peaks of the transmittances of ring resonators 17 and 18 coincide with each other. When electric power is input to heater 34, a refractive index of optical waveguide 16*a* changes and a phase of light is adjusted. A longitudinal mode of the laser resonator is adjusted. The light partially passes through loop mirror 19 and is emitted to the outside of wavelength tunable laser device 100.

Light leaking into optical waveguide 14*b* is absorbed by semiconductor element 42. Light leaking into optical waveguide 12*b* is absorbed by semiconductor elements 44 and 46. Reflected light from loop mirrors 21, 22 and 23 is less likely to propagate to optical waveguide 16. The selectivity of light wavelength is increased and a spectral line width is narrowed.

As shown in FIG. 3A, semiconductor element 40 has a high gain in a wavelength range from 1530 nm to 1540 nm. Example A is used to emit light having a wavelength from 1530 nm to 1540 nm. When the light wavelength is changed to another band, the voltage applied to the semiconductor element and the electric power to be input to the heater are changed.

Example B is used to emit light having a wavelength from 1540 nm to 1550 nm. As shown in Table 1, the forward bias voltage is applied to semiconductor element 42. The light-emitting element is switched to semiconductor element 42. The reverse bias voltages are applied to semiconductor elements 40, 44 and 46. The light absorptivities of semiconductor elements 40, 44 and 46 are increased. As shown in Table 2, an electric power of 15 mW is applied to heater 36. The optical path is switched to optical waveguide 14*b*. An electric power of 2.5 mW is input to heater 35. Heater 37 is in an off state.

Example C is used to emit light having a wavelength from 1550 nm to 1560 nm. As shown in Table 1, the forward bias voltage is applied to semiconductor element 44. The light-emitting element is switched to semiconductor element 44. The reverse bias voltages are applied to semiconductor elements 40, 42 and 46. The light absorptivities of semiconductor elements 40, 42 and 46 are increased. As shown in Table 2, an electric power of 15 mW is applied to heater 35. The optical path is switched to optical waveguide 12*b*. An electric power of 2.5 mW is input to heater 37. Optical waveguide 14*c* is selected as the optical path. Heater 36 is in an off state.

Example D is used to emit light having a wavelength from 1560 nm to 1570 nm. As shown in Table 1, the forward bias voltage is applied to semiconductor element 46. The light-emitting element is switched to semiconductor element 46. The reverse bias voltages are applied to semiconductor elements 40, 42 and 44. The light absorptivities of semiconductor elements 40, 42 and 44 are increased. As shown in Table 2, an electric power of 15 mW is applied to heater 35. An electric power of 15 mW is input to heater 37. The optical path is switched to optical waveguide 14*d*. Heater 36 is in an off state. In Examples B to D, the electric power for heaters 30, 32 and 34 is adjusted.

Figure 4:
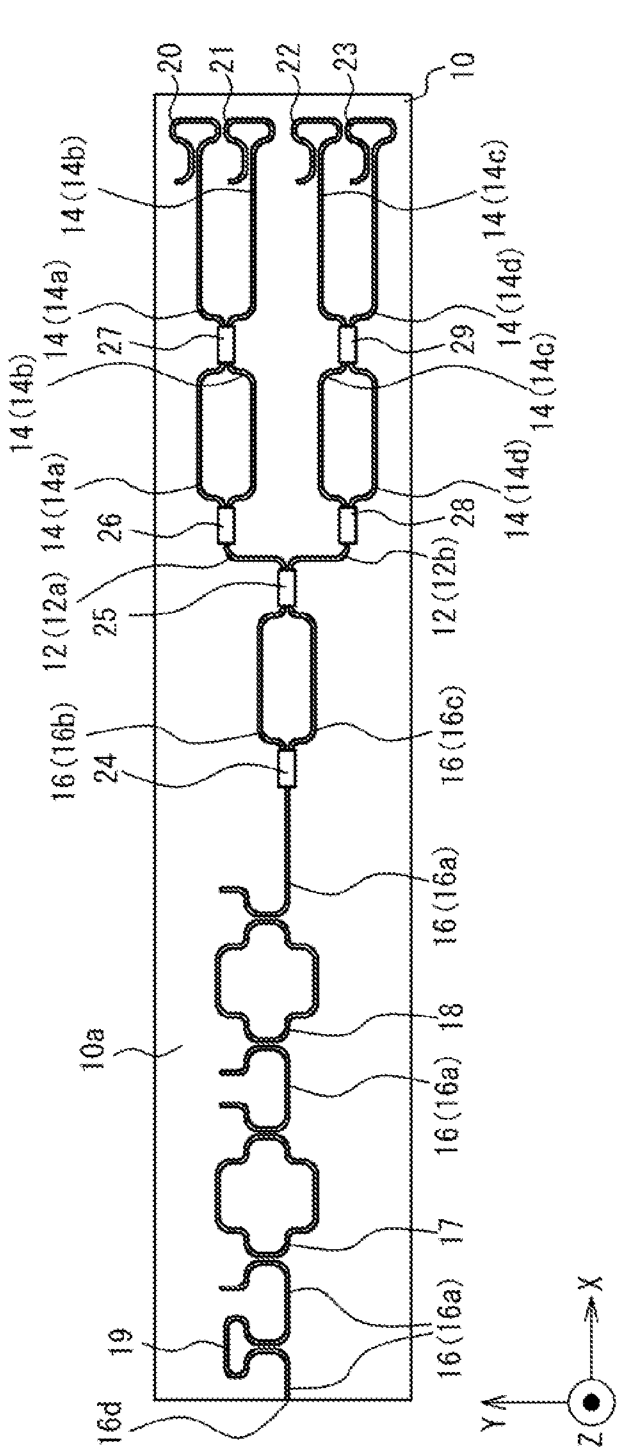
FIG. 4 is a plan view of a wavelength tunable laser device for illustrating a method of manufacturing the wavelength tunable laser device.
Figure 7:
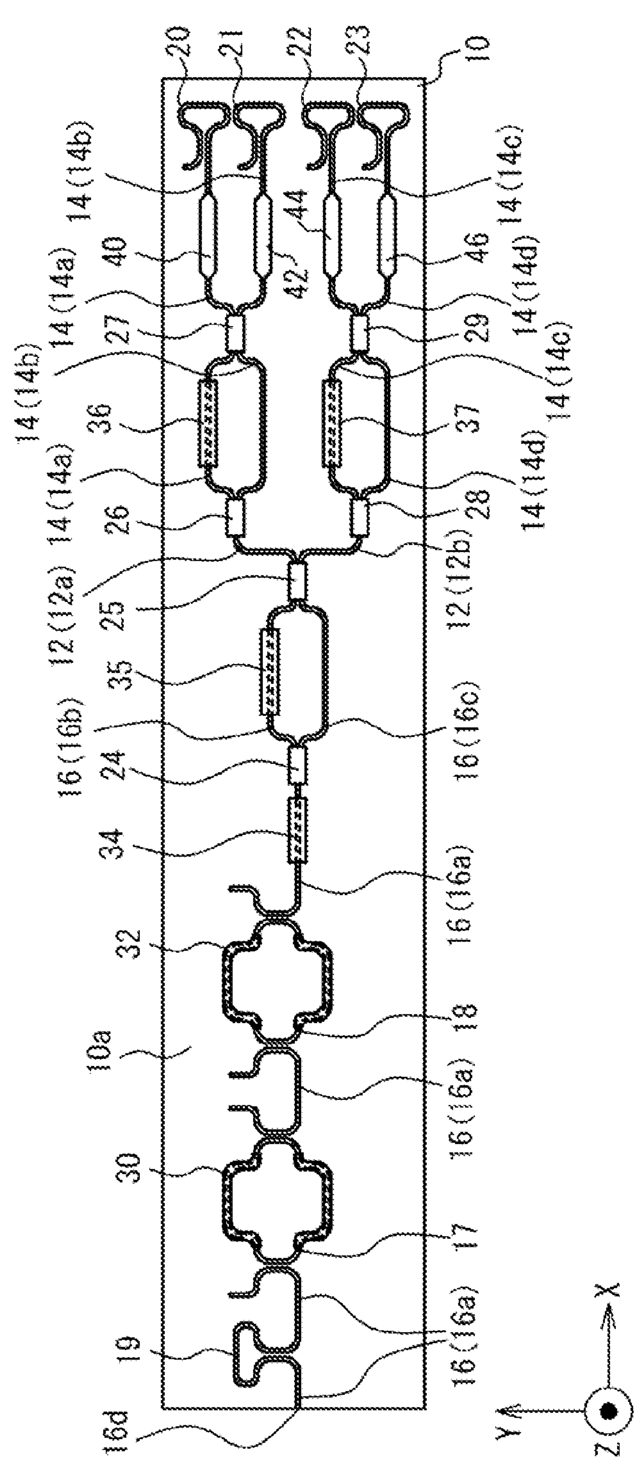
FIG. 7 is a plan view of a wavelength tunable laser device for illustrating a method of manufacturing the wavelength tunable laser device.

FIGS. 4 to 7 are plan views illustrating a method of manufacturing wavelength tunable laser device 100. As shown in FIG. 4, optical waveguides, loop mirrors and ring resonators are formed in substrate 10. Si layer 52 of substrate 10 is dry-etched to form groove 55. Portions of Si layer 52 which are not dry-etched serve as waveguide core 53 and terrace 54.

Figure 5:
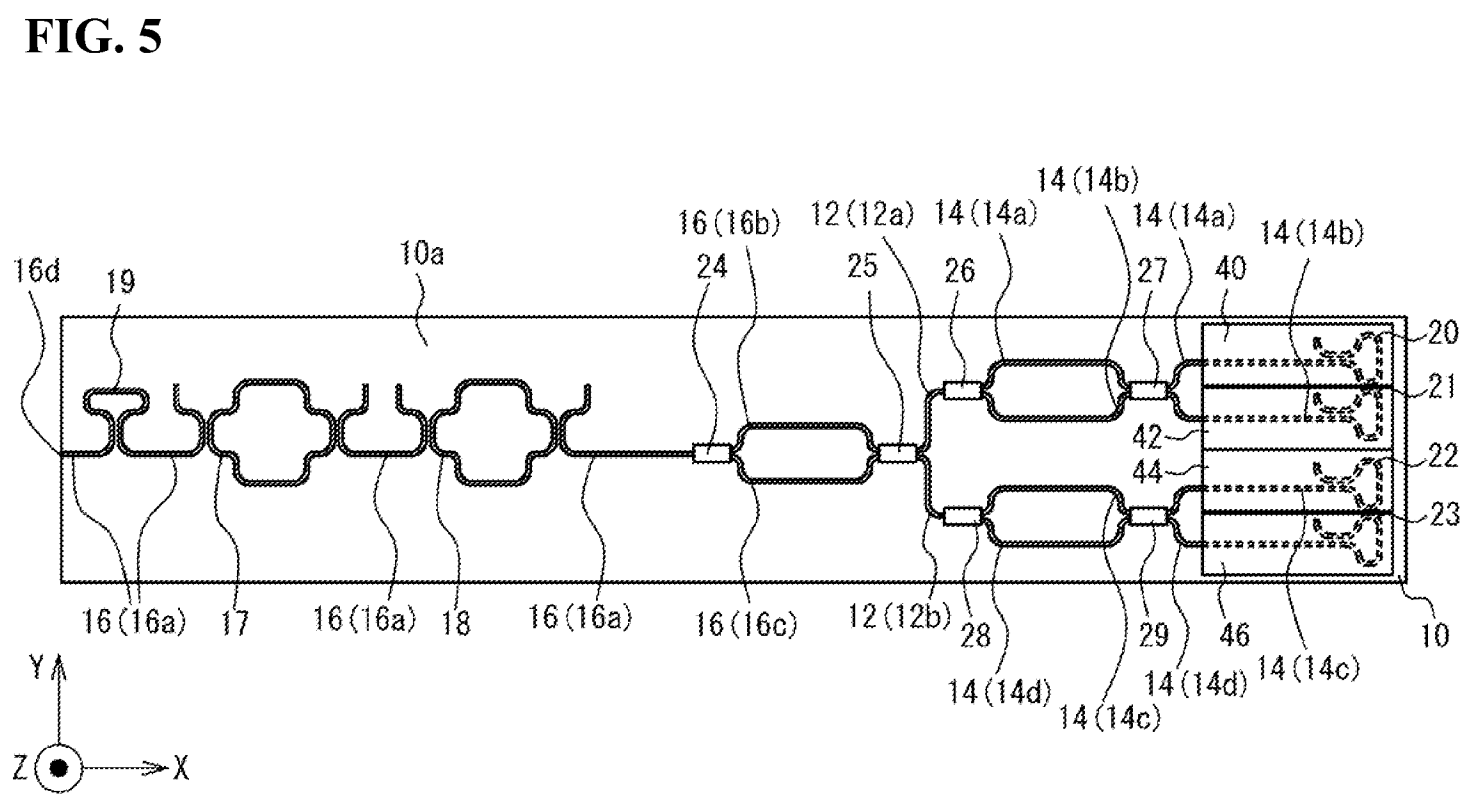

As shown in FIG. 5, semiconductor elements 40, 42, 44 and 46 are bonded on surface 10*a* of substrate 10. For example, cladding layer 60 and substrate 10 are activated by a nitrogen plasma treatment. The activated surfaces are brought into contact with each other to bond the semiconductor elements to substrate 10. The bonding strength is improved by heat treatment. Semiconductor elements 40, 42, 44 and 46 are formed from different wafers from one another. The composition of active layer 62 varies for each wafer. The difference in the composition causes a difference in the wavelength dependence of gain as shown in FIG. 3A. In the bonding step, the semiconductor elements are rectangular and cover the loop mirrors.

Figure 6:
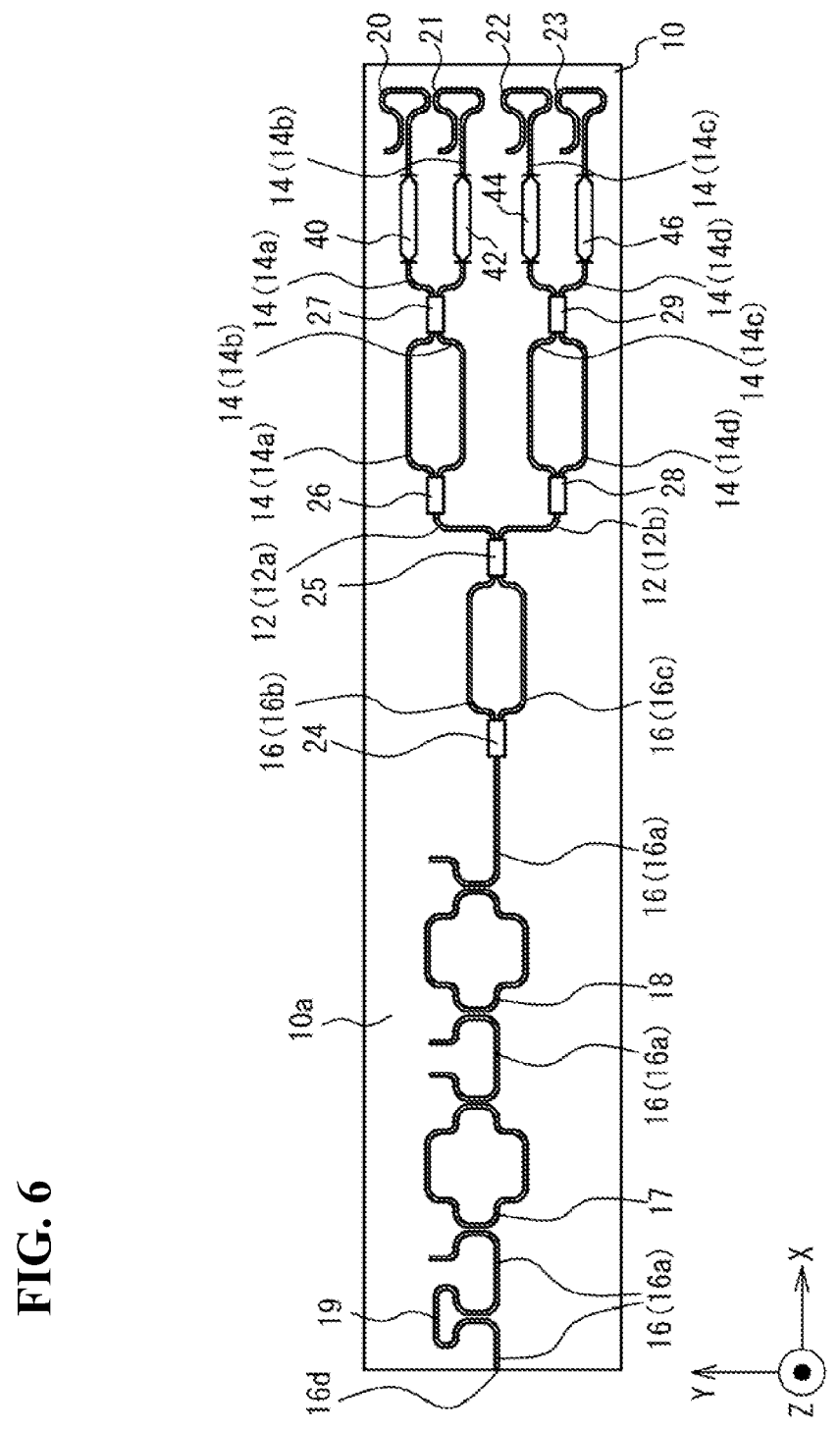

As shown in FIG. 6, dry etching is performed on the semiconductor elements to form the semiconductor elements. The semiconductor elements are removed from over the loop mirrors and remain over the optical waveguides. Mesa 63 and a tapered portion are formed in each of the semiconductor elements.

Insulating film 56 (not shown in FIG. 7) is formed by, for example, a plasma enhanced chemical vapor deposition (PECVD) method. Openings are formed in insulating film 56 by etching. The heaters and the electrodes of the semiconductor elements are formed by vacuum deposition and lift-off. Substrate 10 in a wafer state is etched to form a chip type wavelength tunable laser device 100. Through the above steps, wavelength tunable laser device 100 is formed.

A wavelength tunable laser device can be formed by disposing a plurality of semiconductor elements outside the substrate and causing light from the semiconductor elements to enter the optical waveguide. However, the size of the wavelength tunable laser device is increased.

According to the present embodiment, a plurality of semiconductor elements 40, 42, 44 and 46 are bonded on substrate 10 and on the optical waveguides. Since the plurality of semiconductor elements are integrated, wavelength tunable laser device 100 can be miniaturized. Light having different wavelengths can be emitted by using the plurality of semiconductor elements.

As shown in FIG. 5, one semiconductor element is bonded on each of optical waveguides 14*a*, 14*b*, 14*c* and 14*d* of substrate 10. Compact wavelength tunable laser device 100 can be manufactured. After bonding, semiconductor elements 40, 42, 44, and 46 are etched to form mesas 63 and tapered portions. Since mesas 63 are located over the optical waveguides, light is transferred between active layers 62 and the optical waveguides. Since the semiconductor elements have the tapered portions at the end portions, the coupling efficiency with the optical waveguides is enhanced.

As shown in FIG. 1, substrate 10 is provided with heaters 36 and 37. The optical waveguides are selected by using the heaters. One optical waveguide corresponding to the semiconductor element to be driven is selected. The light emitted from the semiconductor element can be propagated through the optical waveguide. Heater 36 is used to select an optical waveguide configured to transmit the light from among optical waveguides 14*a* and 14*b*. Heater 37 is used to select an optical waveguide configured to transmit the light from among optical waveguides 14*c* and 14*d*. As shown in FIG. 3B, by changing the electric power, the transmittance of one of the two optical waveguides is increased and the transmittance of the other one of the two optical waveguides is decreased. Other than the heater, an element functioning as a switch for switching optical waveguides may be used.

Optical waveguide 12*a* is optically coupled to optical waveguides 14*a* and 14*b*. The light emitted from semiconductor element 40 and the light emitted from semiconductor element 42 propagate through optical waveguide 12*a*. Optical waveguide 12*b* is optically coupled to optical waveguides 14*c* and 14*d*. The light emitted from semiconductor element 44 and the light emitted from semiconductor element 46 propagate through optical waveguide 12*b*. Optical waveguides 12*a* and 12*b* are optically coupled to optical waveguide 16. The light emitted from the semiconductor element propagates through optical waveguide 16. The light can propagate through the optical waveguide and can be emitted from the light emitting port (end portion 16*d*).

As shown in FIG. 1, optical waveguide 12*a* is coupled to optical waveguides 14*a* and 14*b*. Optical waveguide 12*b* is coupled to optical waveguides 14*c* and 14*d*. Heater 35 provided in optical waveguide 16*b* is used to select an optical waveguide configured to transmit light from among optical waveguides 12*a* and 12*b*. As shown in FIG. 3B, by changing the electric power, the transmittance of one of the two optical waveguides is increased and the transmittance of the other one of the two optical waveguides is decreased. Other than the heater, an element functioning as a switch for switching optical waveguides may be used.

In Example A of Tables 1 and 2, the forward bias voltage is applied to semiconductor element 40 to generate light. An electric power of 2.5 mW is input to heater 35 to increase the transmittance of optical waveguide 12*a*. An electric power of 2.5 mW is input to heater 36 to increase the transmittance of optical waveguide 14*a*. That is, light is emitted from one of the plurality of semiconductor elements. Optical waveguide 14*a* is selected on which semiconductor element 40 is bonded. Optical waveguide 12*a* coupled to optical waveguide 14*a* is selected. Light emitted from semiconductor element 40 can be propagated through optical waveguides 12*a*, 14*a*, and 16. In response to the switching among the semiconductor elements, the optical waveguides are also switched. The wavelength of the light can be changed, and the light can be propagated through the optical waveguide.

Wavelength tunable laser device 100 is provided with loop mirrors 19, 20, 21, 22 and 23. Loop mirror 19 faces an end portion of one of semiconductor elements 40, 42, 44 and 46. Loop mirrors 20, 21, 22, and 23 are disposed so as to correspond to semiconductor elements 40, 42, 44, and 46, and are located opposite to loop mirror 19 relative to the semiconductor elements. Loop mirror 19 and loop mirrors 20, 21, 22 and 23 form a laser resonator. Light generated from the semiconductor elements is reflected on loop mirror 19 and on one of loop mirrors 20, 21, 22 and 23. The light is laser-oscillated. When two loop mirrors are provided for each semiconductor element, the number of loop mirrors is eight. As shown in FIG. 1, loop mirror 19 is provided in optical waveguide 16 to reflect light from the four semiconductor elements. The number of loop mirrors is five. Since the number of loop mirrors can be reduced, wavelength tunable laser device 100 can be miniaturized.

As shown in FIG. 1, substrate 10 is provided with two ring resonators 17 and 18. Heaters 30 and 32 are used to control the resonant wavelengths of ring resonators 17 and 18. The wavelength with which the peaks of the transmittances of two ring resonators 17 and 18 coincide with each other is an oscillation wavelength. When two ring resonators are provided for each semiconductor element, the number of ring resonators is eight. As shown in FIG. 1, ring resonators 17 and 18 are provided in optical waveguide 16 to adjust the wavelengths of the light emitted from the four semiconductor elements. Since the number of ring resonators can be reduced, wavelength tunable laser device 100 can be miniaturized. The number of ring resonators may be two or more.

Optical elements other than the loop mirror and the ring resonator may be provided. The arrangement and number of optical waveguides, ring resonators, loop mirrors, and semiconductor elements are not limited to the example shown in FIG. 1.

As shown in FIG. 2B, the semiconductor element includes n-type cladding layer 60, active layer 62, p-type cladding layer 64, and contact layer 66. When a forward bias voltage is applied, carriers are injected into active layer 62, and light is generated. When a reverse bias voltage is applied, active layer 62 absorbs light and generates carriers. By controlling bias voltages applied to the semiconductor elements, the semiconductor elements can be switched between a state of light generation and a state of light absorption. Reverse bias voltages may be applied to semiconductor elements that are not caused to emit light to increase the light absorptivities. Since such semiconductor elements absorb light, unnecessary reflected light can be reduced.

An n-type semiconductor layer, active layer 62, and a p-type semiconductor layer may be stacked in this order on substrate 10. The p-type semiconductor layer, active layer 62, and the n-type semiconductor layer may be stacked in this order on substrate 10.

The wavelength dependence of the gain is determined by a composition of active layer 62. By changing the composition of active layer 62 for each semiconductor element, the wavelength with which the gain reaches a peak is changed as shown in FIG. 3A. This semiconductor element has a high gain within a band of about 10 nm, for example. Since each of semiconductor elements is driven in a high gain band, mode hopping is suppressed and efficiency is improved. Since it is not necessary to increase a threshold current density of the semiconductor element, an increase in electric power consumption is suppressed. The spectral line width is narrowed.

The difference among the wavelengths with which the gains reach the peaks may be 5 nm or more, 10 nm or more, 15 nm or more, or 20 nm or more. In the example of FIG. 3A, the difference in peak wavelengths is 10 nm or more. The number of semiconductor elements is four. Using the four semiconductor elements, light can be emitted in a range of 40 nm from 1530 nm to 1570 nm. The C-band (1529 nm to 1568 nm) is almost covered. The wavelength range in which one semiconductor element is driven may be 10 nm, less than 10 nm, or more than 10 nm.

By increasing the number of semiconductor elements, the wavelength band that can be covered is widened. The number of semiconductor elements bonded on substrate 10 may be two or more, and may be four or more. The number of optical waveguides is changed according to the number of semiconductor elements. One semiconductor element is bonded on one optical waveguide.

The embodiments according to the present disclosure have been described above in detail. However, the present disclosure is not limited to the specific embodiments, and various modifications and changes can be made within the scope of the gist of the present disclosure described in the claims.

What is claimed is:

1. A wavelength tunable laser device comprising:
a substrate;
a plurality of first optical waveguides provided in the substrate;
a plurality of semiconductor elements bonded on a surface of the substrate and on the plurality of first optical waveguides,
wherein the semiconductor elements are formed of a III-V group compound semiconductor and have optical gains, and
wherein wavelengths with which the optical gains of the plurality of semiconductor elements reach peaks differ from one another;
a second optical waveguide provided in the substrate,
wherein the second optical waveguide is optically coupled to the plurality of first optical waveguides; and
a second selector provided on the substrate,
wherein the second optical waveguide is branched into two branched second optical waveguides,
wherein one of the first optical waveguides is optically coupled to one of the two branched second optical waveguides,
wherein another one of the first optical waveguides is optically coupled to the other one of the two branched second optical waveguides, and
wherein the second selector selects a second optical waveguide configured to transmit light from among the two branched second optical waveguides.

2. The wavelength tunable laser device according to claim 1, comprising:
a first selector provided on the substrate,
wherein the first selector selects a first optical waveguide configured to transmit light from among the plurality of first optical waveguides.

3. The wavelength tunable laser device according to claim 2,
wherein the first selector includes a heater,
wherein the heater is provided over one of two of the first optical waveguides, and
wherein the first selector selects a first optical waveguide configured to transmit light from among the two of the first optical waveguides.

4. The wavelength tunable laser device according to claim 1, comprising a plurality of ring resonators provided in the substrate and optically coupled to the second optical waveguide.

5. The wavelength tunable laser device according to claim 1,
wherein the semiconductor elements include a first semiconductor layer, an active layer, and a second semiconductor layer,
wherein the first semiconductor layer, the active layer, and the second semiconductor layer are stacked in this order on the substrate,
wherein the first semiconductor layer has a first conductivity type, and
wherein the second semiconductor layer has a second conductivity type different from the first conductivity type.

6. The wavelength tunable laser device according to claim 1, wherein a difference among the wavelengths with which the optical gains of the plurality of semiconductor elements reach the peaks is 10 nm or more.

7. A method of manufacturing a wavelength tunable laser device, the method comprising:
forming a plurality of first optical waveguides in a surface of a substrate; substrate; and
bonding a plurality of semiconductor elements on the surface of the substrate and on the plurality of first optical waveguides,
wherein the semiconductor elements are formed of a III-V group compound semiconductor and have optical gains, and
wherein wavelengths with which the optical gains of the plurality of semiconductor elements reach peaks differ from one another;
providing a second optical waveguides in the substrate,
wherein the second optical waveguide is optically coupled to the plurality of first optical waveguides,
wherein the second optical waveguide is branched into two branched second optical waveguides; and
providing a second selector on the substrate,
wherein one of the first optical waveguides is optically coupled to one of the two branched second optical waveguides,
wherein another one of the first optical waveguides is optically coupled to the other one of the two branched second optical waveguides, and
wherein the second selector selects a second optical waveguide configured to transmit light from among the two branched second optical waveguides.

8. The method of manufacturing the wavelength tunable laser device according to claim 7, the method comprising:
providing a first selector on the substrate,
wherein the first selector selects a first optical waveguide configured to transmit light from among the plurality of first optical waveguides.

9. The method of manufacturing the wavelength tunable laser device according to claim 8, wherein the first selector includes a heater, wherein the heater is provided over one of two of the first optical waveguides, and wherein the first selector selects a first optical waveguide configured to transmit light from among the two of the first optical waveguides.

10. The method of manufacturing the wavelength tunable laser device according to claim 7, the method comprising:

providing a plurality of ring resonators in the substrate and optically coupled to the second optical waveguide.

11. The method of manufacturing the wavelength tunable laser device according to claim 7, wherein the semiconductor elements include a first semiconductor layer, an active layer, and a second semiconductor layer, wherein the first semiconductor layer, the active layer, and the second semiconductor layer are stacked in this order on the substrate, wherein the first semiconductor layer has a first conductivity type, and wherein the second semiconductor layer has a second conductivity type different from the first conductivity type.

12. The method of manufacturing the wavelength tunable laser device according to claim 7, wherein a difference among the wavelengths with which the optical gains of the plurality of semiconductor elements reach the peaks is 10 nm or more.

13. A wavelength tunable laser device comprising:

a substrate;

a plurality of first optical waveguides provided in the substrate;

a plurality of semiconductor elements bonded on a surface of the substrate and on the plurality of first optical waveguides, wherein the semiconductor elements are formed of a III-V group compound semiconductor and have optical gains, and wherein wavelengths with which the optical gains of the plurality of semiconductor elements reach peaks differ from one another;

a second optical waveguide provided in the substrate, wherein the second optical waveguide is optically coupled to the plurality of first optical waveguides;

a first reflector; and a second reflector, wherein the first reflector is optically coupled to the plurality of first optical waveguides, and wherein the second reflector is located opposite to the first reflector across the plurality of semiconductor elements, and is optically coupled to the second optical waveguide.

14. The wavelength tunable laser device according to claim 13, comprising:

a first selector provided on the substrate, wherein the first selector selects a first optical waveguide configured to transmit light from among the plurality of first optical waveguides.

15. The wavelength tunable laser device according to claim 14, wherein the first selector includes a heater, wherein the heater is provided over one of two of the first optical waveguides, and wherein the first selector selects a first optical waveguide configured to transmit light from among the two of the first optical waveguides.

16. The wavelength tunable laser device according to claim 13, wherein the semiconductor elements include a first semiconductor layer, an active layer, and a second semiconductor layer, wherein the first semiconductor layer, the active layer, and the second semiconductor layer are stacked in this order on the substrate, wherein the first semiconductor layer has a first conductivity type, and wherein the second semiconductor layer has a second conductivity type different from the first conductivity type.

17. The wavelength tunable laser device according to claim 13, wherein a difference among the wavelengths with which the optical gains of the plurality of semiconductor elements reach the peaks is 10 nm or more.

* * * * *